(12) United States Patent
Chueh

(10) Patent No.: US 9,793,878 B2
(45) Date of Patent: Oct. 17, 2017

(54) POWER DIVIDING AND COMBINING CIRCUIT HAVING FILTERING FUNCTION

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Yu-Chih Chueh, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/985,725

(22) Filed: Dec. 31, 2015

(65) Prior Publication Data

US 2017/0187354 A1    Jun. 29, 2017

(30) Foreign Application Priority Data

Dec. 28, 2015    (TW) .............................. 104143937 A

(51) Int. Cl.
*H01P 5/12*    (2006.01)
*H03H 11/04*    (2006.01)
*H03H 7/06*    (2006.01)

(52) U.S. Cl.
CPC .............. *H03H 11/04* (2013.01); *H03H 7/06* (2013.01)

(58) Field of Classification Search
CPC ................................. H03H 11/04; H03H 7/06
USPC ......................................................... 333/134
See application file for complete search history.

(56) References Cited

U.S. PATENT DOCUMENTS

| 4,851,795 | A | 7/1989 | Beckwith |
| 6,975,841 | B2 | 12/2005 | Uriu et al. |
| 7,696,841 | B2 | 4/2010 | Chen |
| 9,531,328 | B2 * | 12/2016 | Frei ........................ H03F 1/0288 |

FOREIGN PATENT DOCUMENTS

TW    M260882    4/2005

* cited by examiner

*Primary Examiner* — Robert Pascal
*Assistant Examiner* — Kimberly Glenn
(74) *Attorney, Agent, or Firm* — Steven Reiss

(57) ABSTRACT

A power dividing circuit includes a power dividing input terminal, a high pass filtering module and a low pass filtering module. The power dividing input terminal divides a signal into two divided signals. The high pass filtering module includes two high pass filtering units. The low pass filtering module includes two low pass filtering units. Each divided signal is filtered by one of the two high pass filtering units and one of the two low pass filtering units.

8 Claims, 7 Drawing Sheets

POWER DIVIDING AND COMBINING CIRCUIT HAVING FILTERING FUNCTION

CROSS-REFERENCE TO RELATED APPLICATIONS

This application claims priority to Taiwanese Patent Application No. 104143937 filed on Dec. 28, 2015, the contents of which are incorporated by reference herein.

FIELD

The subject matter herein generally relates to power dividing or combining circuits, and in particular to a power dividing or combining circuit having filtering function.

BACKGROUND

In wireless communication field, power dividing circuits and power combining circuits are used widely. When the signal transmitted in the power dividing circuit or the power combining circuit has a wide range of frequency, the signal may disturb other electronic components.

BRIEF DESCRIPTION OF THE DRAWINGS

Implementations of the present technology will now be described, by way of example only, with reference to the attached figures.

DETAILED DESCRIPTION

Figure 1:
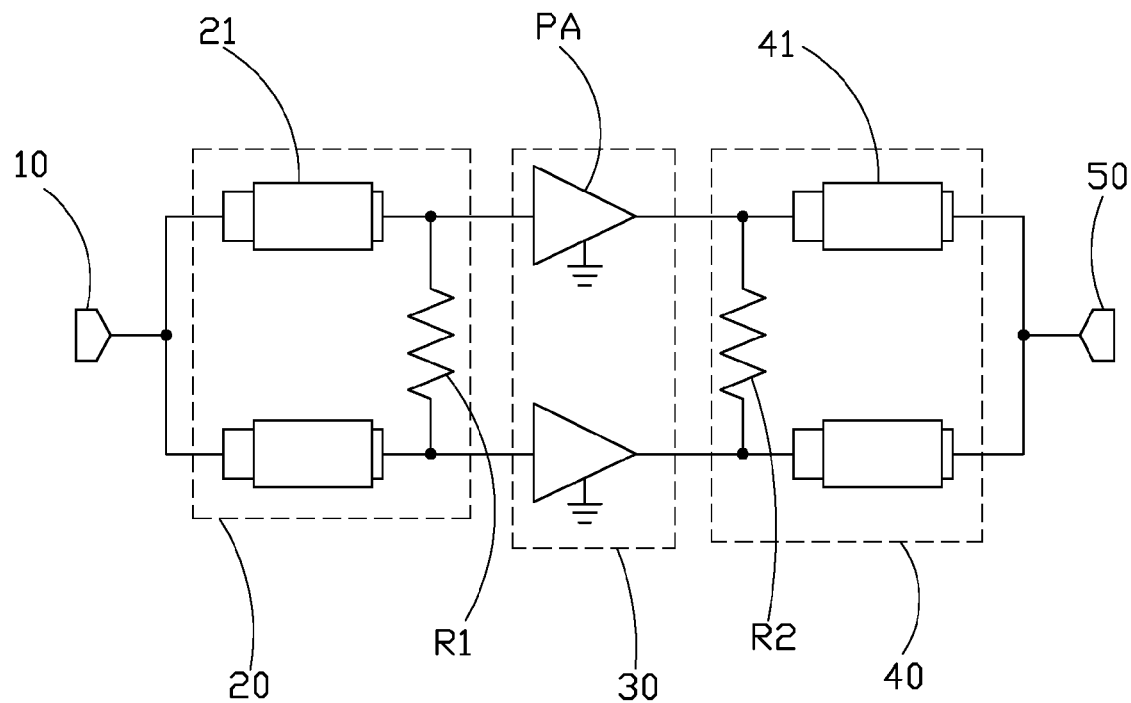
FIG. 1 is a diagrammatic view of a power dividing and combining circuit having filtering function.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series and the like.

FIG. 1 illustrates that a power dividing and combination circuit comprises a power dividing input terminal 10, a high pass filtering module 20, a power amplifying module 30, a low pass filtering module 40, and a power combining output terminal 50.

The high pass filtering module 20 is connected between the power dividing input terminal 10 and the power amplifying module 30. The high pass filtering module 20 comprises two parallel connection high pass filtering units 21 and a resistor R1. The resistor R1 is connected between the two high pass filtering units 21.

The power amplifying module 30 comprises two power amplifiers PA. Each power amplifier PA is in series connected to a high pass filtering unit 21.

The low pass filtering module 40 is connected between the power amplifying module 30 and the power combining output terminal 50. The low pass filtering module 40 comprises two low pass filtering units 41 and a resistor R2. Each low pass filtering unit 41 is in series connected to a power amplifier PA. The resistor R2 is connected between the two low pass filtering units 41.

Figure 2:
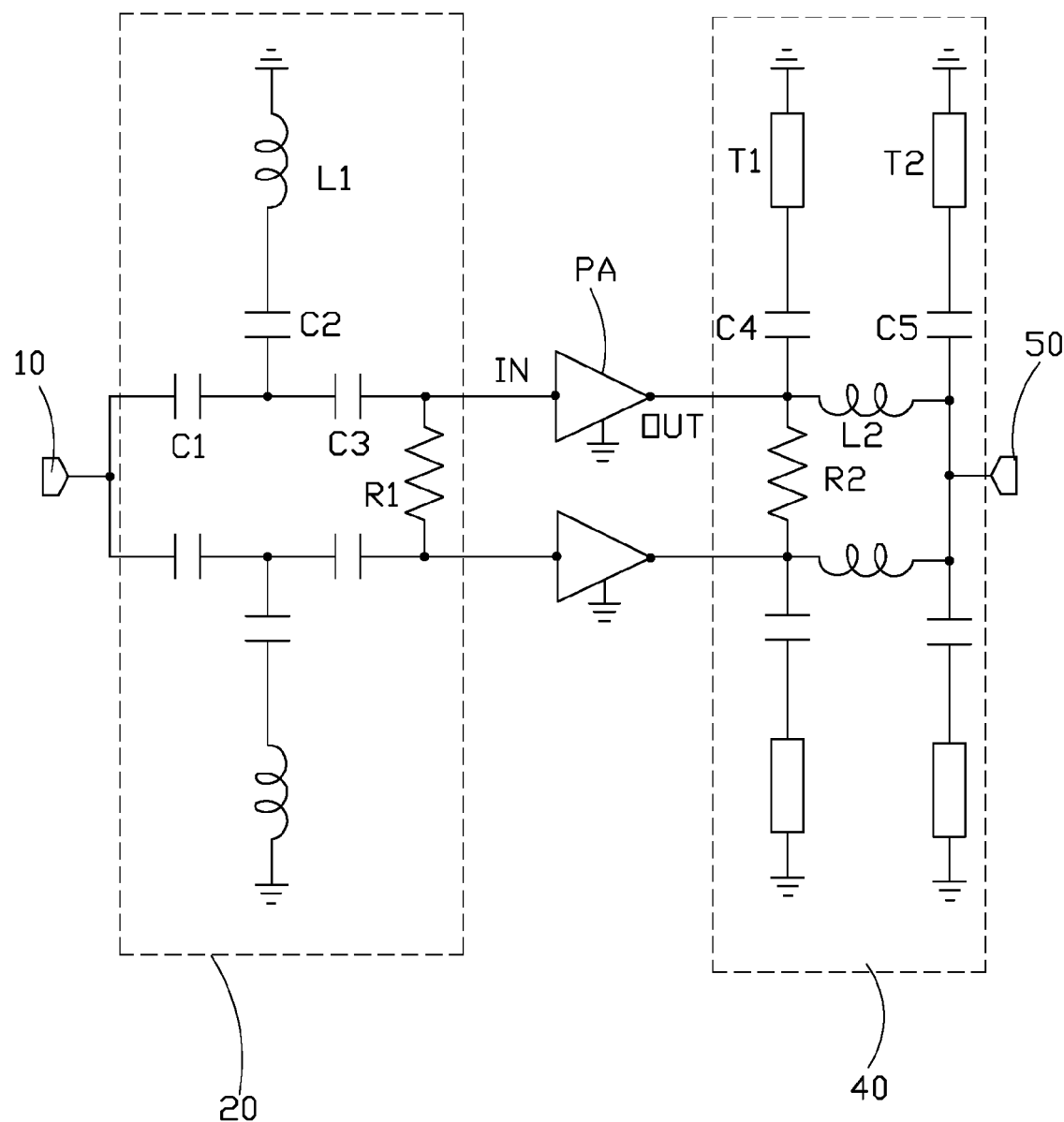
FIG. 2 is a circuit diagram of the power dividing and combining circuit of FIG. 1.

FIG. 2 illustrates a circuit diagram of the power dividing and combination circuit of FIG. 1. In at least one embodiment, the high pass filtering unit 21 comprises a first inductor L1, a first capacitor C1, a second capacitor C2, and a third capacitor C3. One end of the first capacitor C1 is connected to the power dividing input terminal 10, and another end of the first capacitor C1 is connected to one end of the third capacitor C3. Another end of the third capacitor C3 is connected to an input end IN of the power amplifier PA. One end of the first inductor L1 is connected to ground. Another end of the first inductor L1 is connected to one end of the second capacitor C2. Another end of the second capacitor C2 is connected to a junction point of the first capacitor C1 and the third capacitor C3.

The low pass filtering unit 41 comprises a fourth capacitor C4, a fifth capacitor C5, and a second inductor L2. One end of the second inductor L2 is connected to an output end OUT of the power amplifier PA. Another end of the second inductor L2 is connected to the power combining output terminal 50. One end of the fourth capacitor C4 is connected to the output end OUT. Another end of the fourth capacitor C4 is connected to ground via a transmission line T1. One end of the fifth capacitor C5 is connected to the power combining output terminal 50. Another end of the fifth capacitor C5 is connected to ground via a transmission line T2.

The high pass filtering unit 21 and the low pass filtering unit 41 are not limited to the above circuit, and can be other circuit configured to be a low pass filter and a high pass filter.

When an signal is input into the power dividing input terminal 10 of power dividing and combination circuit, the signal is divided into two divided signals. Each of the two divided signal is input into one high pass filtering unit 21. The high pass filtering unit 21 filters low frequency portion of the divided signal. Then, the divided signal is amplified by the power amplifier PA. The low pass filtering unit 41 then filters high frequency portion of the divided signal. The two divided signals are sent to the power combining output terminal 50. The power combining output terminal 50 combines the two divided signal together to form a combination signal and sends out the combination signal.

In the power dividing and combination circuit of FIG. 2, the position of the high pass filtering module 20 and the low pass filtering module 40 can be exchanged.

Figure 3:
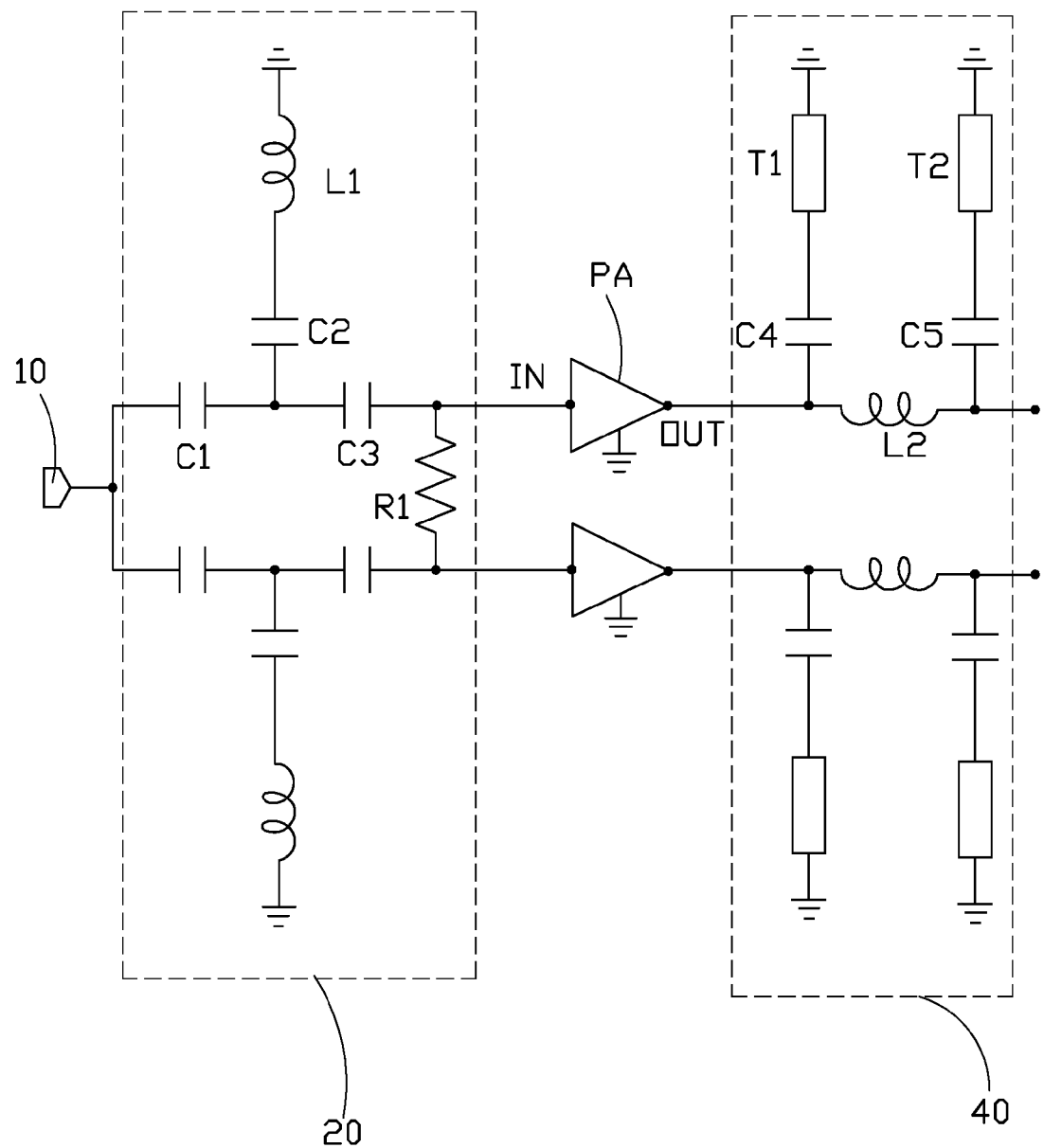
FIG. 3 is a circuit diagram of a power dividing circuit.

FIG. 3 illustrates a circuit diagram of a power dividing circuit. Comparing the circuit of FIG. 3 to the circuit of FIG. 2, the resistor R2 and the power combining output terminal 50 are omitted in FIG. 3. Therefore, the two divided signals from the two low pass filtering units 41 can be transmitted to two components.

Figure 4:
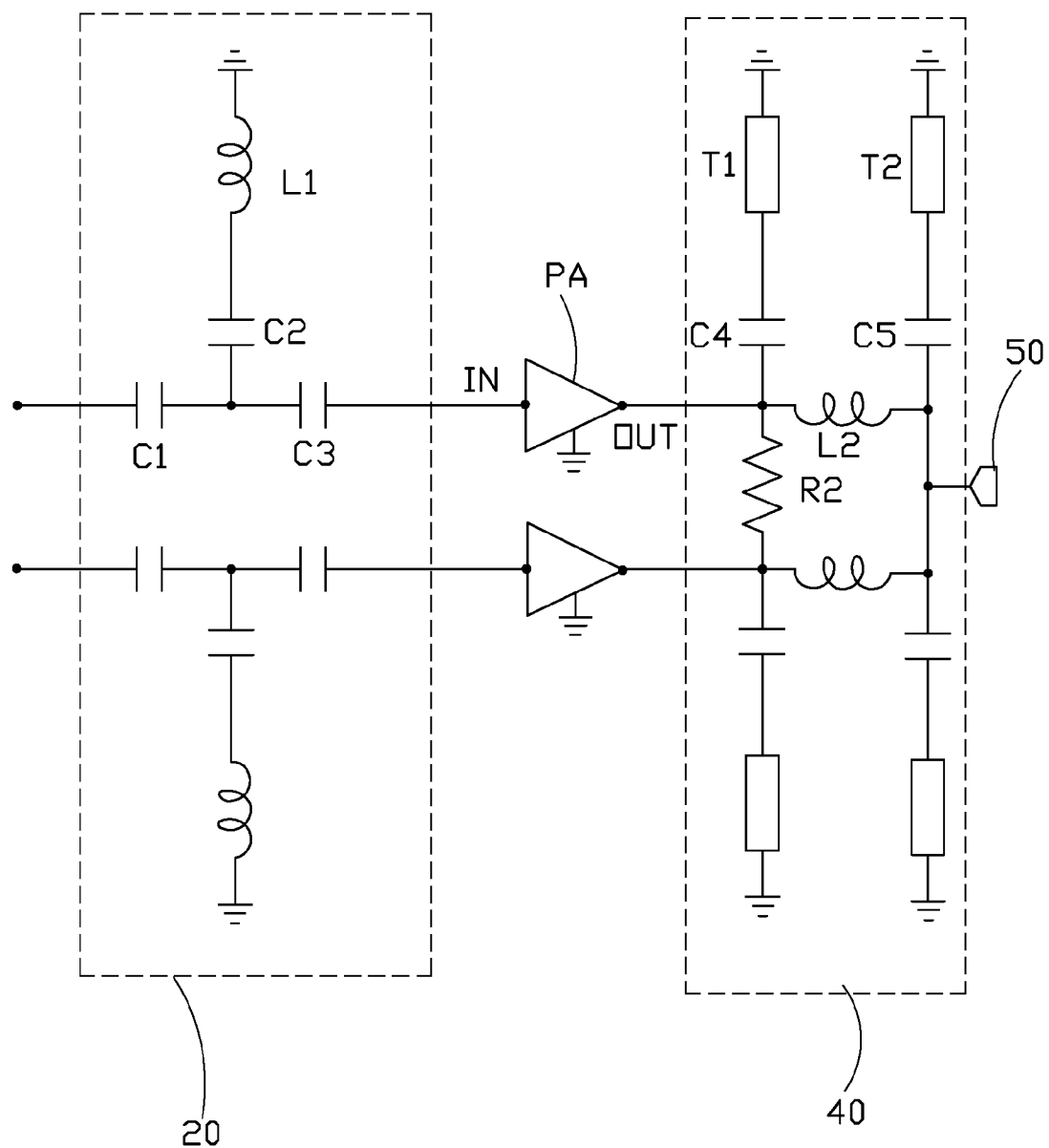
FIG. 4 is a circuit diagram of a power combining circuit.

FIG. 4 illustrates a circuit diagram of a power combining circuit. Comparing to the circuit of FIG. 2, the resistor R1 and the power dividing input terminal 10 are omitted in FIG. 4. Therefore, two separated signal can be inputted into the two high pass filtering unit 21 and then combined at the power combining output terminal 50.

In other embodiments, the power amplifier PA can be omitted.

Figure 5:
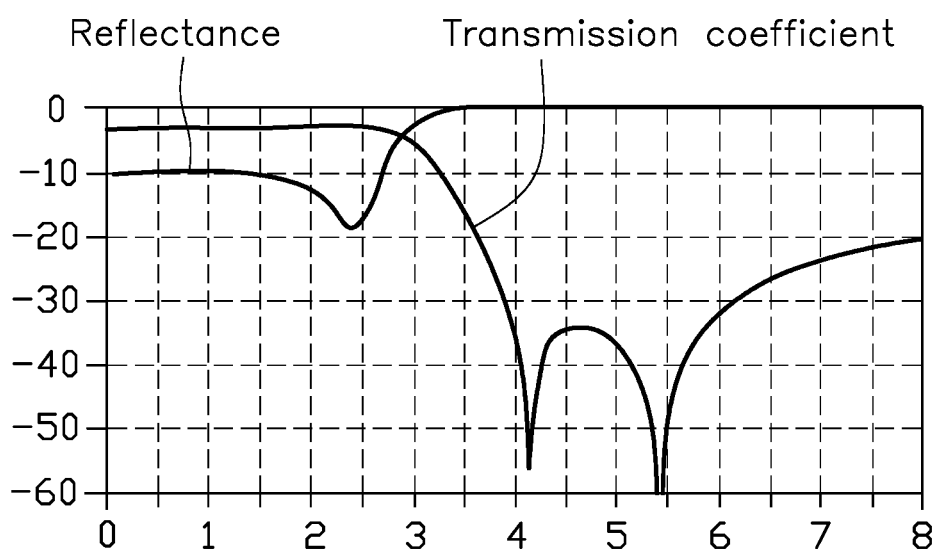
FIG. 5 is a frequency response chart of signal filtered by a low pass filtering module.

FIG. 5 illustrates a signal status when the signal is filtered by the low pass filtering module 40. A low frequency portion of the signal has good reflectance and transmission coefficient. Therefore, the low frequency portion of the signal is transmitted well when the signal passes through the low pass filtering module 40.

Figure 6:
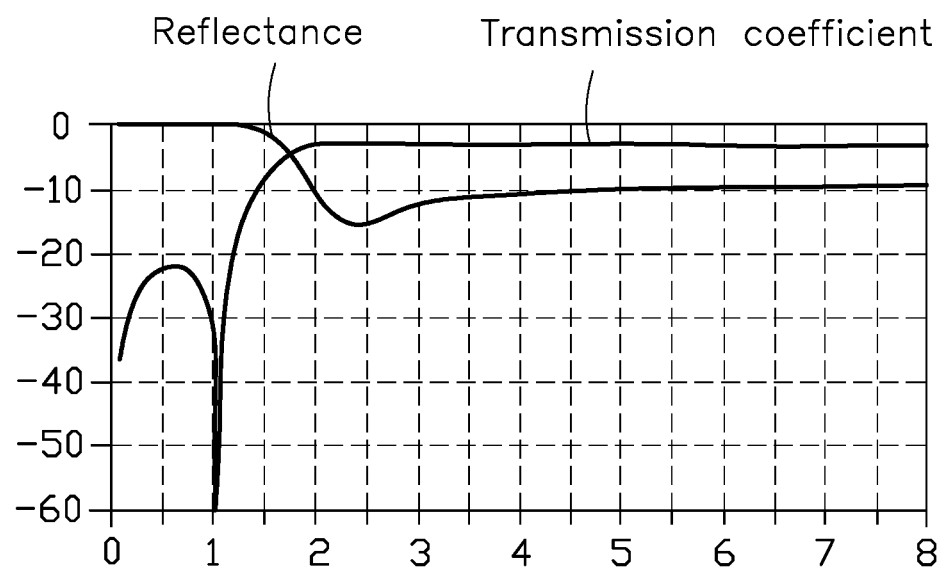
FIG. 6 is a frequency response chart of signal filtered by a high pass filtering module.

FIG. 6 illustrates a signal status when the signal is filtered by the high pass filtering module 20. A high frequency portion of the signal has good reflectance and transmission coefficient. Therefore, the high frequency portion of the signal is transmitted well when the signal passes through the high pass filtering module 20.

Figure 7:
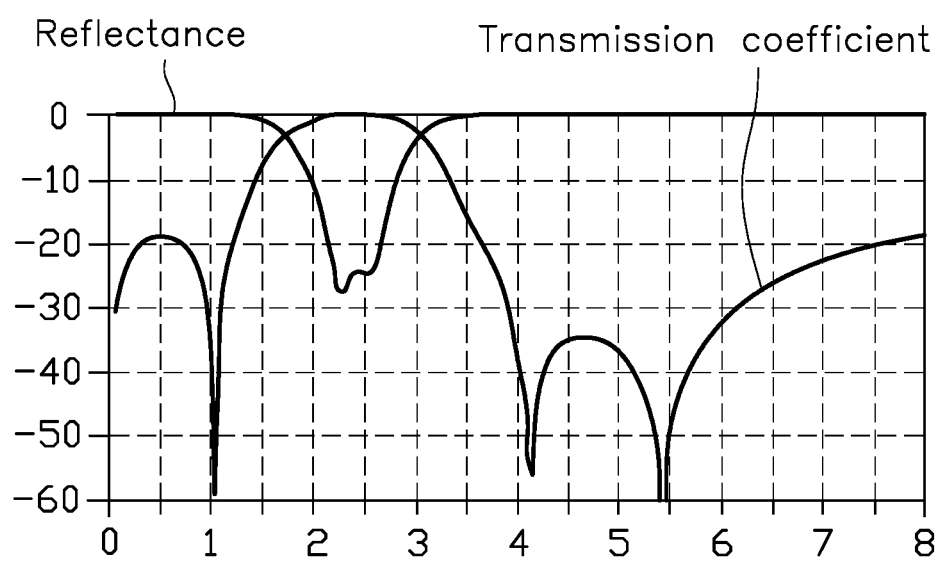
FIG. 7 is a frequency response chart of the power dividing and combining circuit of FIG. 1.

FIG. 7 illustrates a signal status when the signal is filtered by the low pass filtering module 40 and the high pass filtering module 20. A portion of the signal whose frequency is between 1.7G and 3G has good reflectance and transmission coefficient. Therefore, the portion of the signal whose frequency is between 1.7G and 3G is transmitted well when the signal passes through the low pass filtering module 40 and the high pass filtering module 20.

The above power dividing and combination circuit can divide or combine signal and also can filter the signal.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A power dividing circuit comprising:
 a power dividing input terminal configured to divide a signal into two divided signals;
 a high pass filtering module comprising two high pass filtering units; and
 a low pass filtering module comprising two low pass filtering units, wherein each of the two divided signals is configured to be filtered by one of the two high pass filtering units and one of the two low pass filtering units;
 wherein a resistor is connected between the two low pass filtering units, and another resistor is connected between the two high pass filtering units.

2. The power dividing circuit of claim 1, wherein a power amplifier is in series connected between the high pass filtering unit and the low pass filtering unit.

3. The power dividing circuit of claim 2, wherein the high pass filtering unit comprises a first inductor, a first capacitor, a second capacitor and a third capacitor, one end of the first capacitor is connected to the power dividing input terminal, another end of the first capacitor is connected to one end of the third capacitor, another end of the third capacitor is connected to an input end of the power amplifier, one end of the first inductor is connected to ground, another end of the first inductor is connected to one end of the second capacitor, and another end of the second capacitor is connected to a junction point of the first capacitor and the third capacitor.

4. The power dividing circuit of claim 3, wherein the low pass filtering unit comprises a fourth capacitor, a fifth capacitor and a second inductor, one end of the second inductor is connected to an output end of the power amplifier, another end of the second inductor outputs a signal, one end of the fourth capacitor is connected to the output end of the power amplifier, another end of the fourth capacitor is connected to ground via a transmission line, one end of the fifth capacitor is connected to the end of the second inductor which outputs the signal, and another end of the fifth capacitor is connected to ground via a transmission line.

5. An power combining circuit, comprising:
 a high pass filtering module comprising two high pass filtering units;
 a low pass filtering module comprising two low pass filtering units, each low pass filtering unit in series connected to one high pass filtering unit to filter an signal; and
 a power combining output terminal configured to combine signals filtered by the two low pass filtering units and the two high pass filtering units;
 a resistor is connected between the two low pass filtering units, and another resistor is connected between the two high pass filtering units.

6. The power combining circuit of claim 5, wherein a power amplifier is in series connected between the high pass filtering unit and the low pass filtering unit.

7. The power combining circuit of claim 6, wherein the high pass filtering unit comprises a first inductor, a first capacitor, a second capacitor and a third capacitor, one end of the first capacitor receives the signal, another end of the first capacitor is connected to one end of the third capacitor, another end of the third capacitor is connected to an input end of the power amplifier, one end of the first inductor is connected to ground, another end of the first inductor is connected to one end of the second capacitor, and another end of the second capacitor is connected to a junction point of the first capacitor and the third capacitor.

8. The power combining circuit of claim 7, wherein the low pass filtering unit comprises a fourth capacitor, a fifth capacitor and a second inductor, one end of the second inductor is connected to an output end of the power amplifier, another end of the second inductor is connected to the power combining output terminal, one end of the fourth capacitor is connected to the output end of the power amplifier, another end of the fourth capacitor is connected to ground via a transmission line, one end of the fifth capacitor is connected to the power combining output terminal, and another end of the fifth capacitor is connected to ground via a transmission line.

* * * * *